US011338257B2

(12) United States Patent
Langstrand et al.

(10) Patent No.: US 11,338,257 B2
(45) Date of Patent: May 24, 2022

(54) METHODS AND APPARATUS COMPRISING A FIRST CONDUIT CIRCUMSCRIBED BY A SECOND CONDUIT

(71) Applicant: Corning Incorporated, Corning, NY (US)

(72) Inventors: John Alan Langstrand, Fayeteville, NY (US); Dong-gun Moon, Yongin-si (KR); Elias Panides, Horseheads, NY (US); Abhijit Rao, Painted Post, NY (US); Jung-Hun Yun, Asan (KR)

(73) Assignee: Corning Incorporated, Corning, NY (US)

( * ) Notice: Subject to any disclaimer, the term of this patent is extended or adjusted under 35 U.S.C. 154(b) by 123 days.

(21) Appl. No.: 16/675,786

(22) Filed: Nov. 6, 2019

(65) Prior Publication Data

US 2020/0139314 A1    May 7, 2020

Related U.S. Application Data

(60) Provisional application No. 62/756,265, filed on Nov. 6, 2018.

(51) Int. Cl.
*B01F 25/42* (2022.01)
*B01F 25/421* (2022.01)
(Continued)

(52) U.S. Cl.
CPC ............ *B01F 25/423* (2022.01); *B01F 23/19* (2022.01); *C23C 16/45512* (2013.01)

(58) Field of Classification Search
CPC .............................. B01F 5/0605; B01F 25/423
(Continued)

(56) References Cited

U.S. PATENT DOCUMENTS 3,601,320 A * 8/1971 Plessis ................. A01G 25/023
239/542
5,425,723 A * 6/1995 Wang .................. A61M 25/007
138/114
(Continued)

FOREIGN PATENT DOCUMENTS

WO     2012/146312 A1    11/2012

OTHER PUBLICATIONS

International Search Report and Written Opinion of the International Searching Authority; PCT/US2019/059808; dated Apr. 24, 2020; 10 Pages; European Patent Office.

*Primary Examiner* — David L Sorkin
(74) *Attorney, Agent, or Firm* — William J. Tucker; Shantanu Pathak

(57) ABSTRACT

A fluid distributor comprises a first conduit extending along a first elongated axis and a second conduit circumscribing the first conduit. A first area comprises a cross-sectional flow area of the first conduit taken perpendicular to the first elongated axis. The first conduit comprises a first plurality of orifices comprising a first combined cross-sectional area. The second conduit comprises a second plurality of orifices comprising a second combined cross-sectional area. A first ratio of the first area to the first combined cross-sectional area can be about 2 or more. A second ratio of the first combined cross-sectional area to the second combined cross-sectional area can be about 2 or more. An angle between a direction of an orifice axis of a first orifice of the first plurality of orifices and a direction of an orifice axis of a first orifice of the second plurality of orifices can be from about 45° to 180°.

17 Claims, 4 Drawing Sheets

(51) Int. Cl.
*C23C 16/455* (2006.01)
*B01F 23/10* (2022.01)

(58) Field of Classification Search
USPC .......................................... 366/336; 138/114
See application file for complete search history.

(56) References Cited

U.S. PATENT DOCUMENTS

| | | | |
|---|---|---|---|
| 5,793,831 A * | 8/1998 | Tsiklauri | G21D 5/16 |
| | | | 376/317 |
| 6,488,824 B1 | 12/2002 | Hollars et al. | |
| 6,538,041 B1 * | 3/2003 | Marelli | B01F 3/0807 |
| | | | 366/165.4 |
| 7,166,199 B2 | 1/2007 | Hartig | |
| 7,832,920 B2 * | 11/2010 | Wood | C09K 3/00 |
| | | | 366/170.3 |
| 8,574,411 B2 | 11/2013 | White et al. | |
| 9,732,412 B2 | 8/2017 | Hoffmann et al. | |
| 2002/0134507 A1 | 9/2002 | DeDontney et al. | |
| 2004/0118678 A1 | 6/2004 | Hartig | |
| 2011/0064877 A1 * | 3/2011 | Matsumura | C23C 16/455 |
| | | | 427/248.1 |
| 2013/0068161 A1 | 3/2013 | White et al. | |
| 2014/0001037 A1 | 1/2014 | Cao | |

* cited by examiner

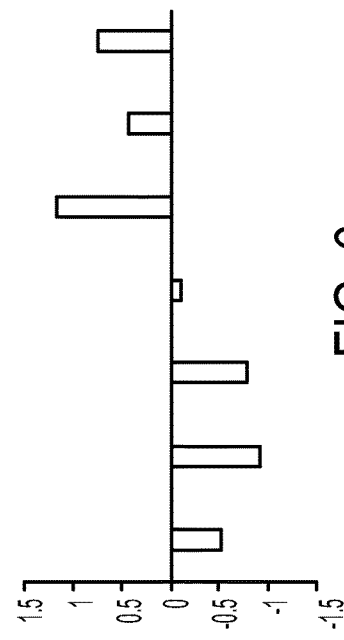
FIG. 6
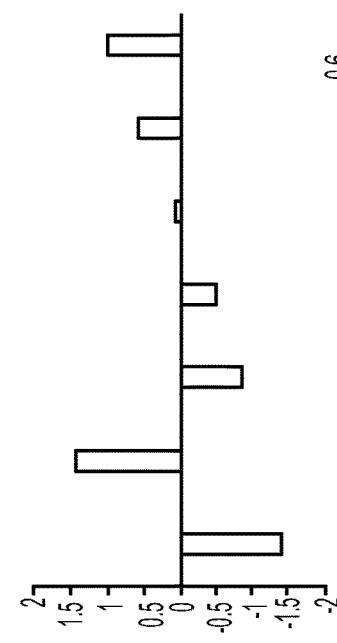
FIG. 7
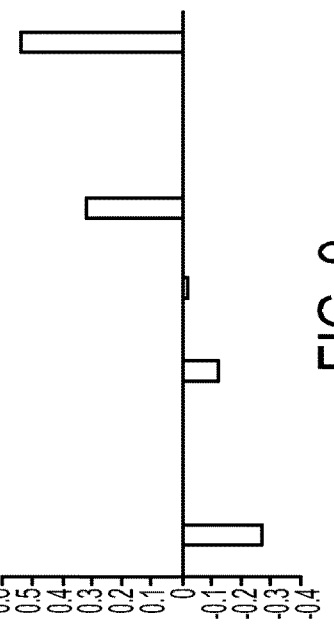
FIG. 9
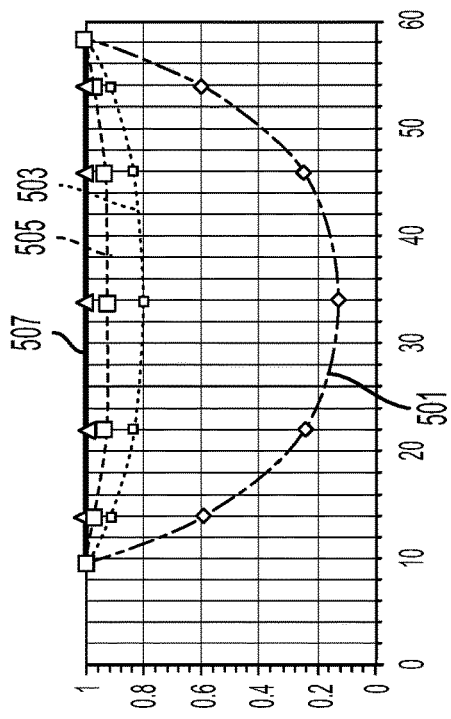
FIG. 5
FIG. 8

METHODS AND APPARATUS COMPRISING A FIRST CONDUIT CIRCUMSCRIBED BY A SECOND CONDUIT

This application claims the benefit of priority under 35 U.S.C. § 119 of U.S. Provisional Application Ser. No. 62/756,265, filed on Nov. 6, 2018, the content of which is relied upon and incorporated herein by reference in its entirety.

The present disclosure relates generally to fluid distributors and methods for using the same to deposit a layer and, more particularly, to fluid distributors comprising a first conduit circumscribed by a second conduit and methods for using the same to deposit a layer.

BACKGROUND

Known fluid distributors fail to distribute fluid uniformly. In deposition methods, nonuniform fluid distribution can lead to variations in thickness of the deposited layer. In optical applications involving carefully tuned interference stacks or other applications, such variation can lead to unacceptably low yield rates. Additionally, variations in thickness can produce internal stress distributions that can impair the functionality of the resulting device. Example devices can include liquid crystal displays (LCDs), electrophoretic displays (EPD), organic light emitting diode displays (OLEDs), plasma display panels (PDPs), and touch sensors.

Also, known fluid distributors may distribute fluid that is not well-mixed. In reactive deposition methods, this can produce layers with variations in stoichiometry. For optical applications, variations in stoichiometry can correspond to variations in refractive index. In high performance optical devices such as those listed above, such variations may be noticeable by consumers.

Accordingly, there is a need for new fluid distributors, which distribute well-mixed fluids with substantially uniform stoichiometry and mass-flow rates. Such fluid distributors are needed to increase deposition yield rates and enable new technologies requiring more uniform distributions.

SUMMARY

There are set forth fluid distributors comprising a first conduit circumscribed by a second conduit that can be used to deposit a layer with substantially uniform thickness and substantially uniform stoichiometry. Some example embodiments of the disclosure are described below with the understanding that any of the embodiments may be used alone or in combination with one another.

Embodiment 1

A fluid distributor comprises a first conduit that can extend along a first elongated axis and a second conduit that may circumscribe the first conduit. The first conduit can comprise a first flow area comprising a cross-sectional area taken perpendicular to the first elongated axis. Also, the first conduit can comprise a first plurality of orifices comprising a first combined cross-sectional flow area. A first ratio of the first cross-sectional area to the first combined cross-sectional flow area can be about 2 or more. A first orifice of the first plurality of orifices may comprise an orifice axis that is perpendicular to the first elongated axis. The second conduit can extend along a second elongated axis. The second conduit can comprise a second plurality of orifices comprising a second combined cross-sectional flow area. A second ratio of the first combined cross-sectional flow area of the first plurality of orifices to the second combined cross-sectional flow area of the second plurality of orifices can be about 2 or more. A first orifice of the second plurality of orifices may comprise an orifice axis that can be perpendicular to the second elongated axis. A first angle between a direction of the orifice axis of the first orifice of the first plurality of orifices and a direction of the orifice axis of the first orifice of the second plurality of orifices can be in a range from about 45° to about 180°.

Embodiment 2

The fluid distributor of embodiment 1, where the first ratio is greater than the second ratio.

Embodiment 3

The fluid distributor of embodiment 1 or embodiment 2, where the first angle is in a range from about 90° to about 180°.

Embodiment 4

The fluid distributor of any one of embodiments 1-3, where the first angle is in a range from about 90° to about 135°.

Embodiment 5

The fluid distributor of any one of embodiments 1-3, where the first angle is in a range from about 170° to about 180°.

Embodiment 6

The fluid distributor of any one of embodiments 1-5, where the first plurality of orifices is staggered relative to the second plurality of orifices in a direction of the first elongated axis.

Embodiment 7

The fluid distributor of any one of embodiments 1-6, where the first conduit comprises an inner circular profile taken along a cross-section perpendicular to the first elongated axis.

Embodiment 8

The fluid distributor of any one of embodiments 1-7, where the second conduit comprises an inner circular profile taken along a cross-section perpendicular to the second elongated axis.

Embodiment 9

The fluid distributor of any one of embodiments 1-8, where a second orifice of the second plurality of orifices comprises an orifice axis that can be perpendicular to the second elongated axis. An angle between the direction of the orifice axis of the first orifice of the second plurality of orifices and a direction of the orifice axis of the second orifice of the second plurality of orifices is in a range from about 45° to about 180°.

Embodiment 10

The fluid distributor of embodiment 9, where the angle between the direction of the orifice axis of the first orifice of the second plurality of orifices and the direction of the orifice axis of the second orifice of the second plurality of orifices is in a range from about 90° to about 135°.

Embodiment 11

The fluid distributor of any one of embodiments 1-8, where a second orifice of the second plurality of orifices comprises an orifice axis that can be perpendicular to the second elongated axis. The orifice axis of the first orifice of the second plurality of orifices and the orifice axis of the second orifice of the second plurality of orifices extends along a first common plane that can be perpendicular to the second elongated axis.

Embodiment 12

The fluid distributor of any one of embodiments 1-8, where a second orifice of the second plurality of orifices may comprise a second orifice cross-sectional flow area. The first orifice of the second plurality of orifices comprises a first orifice cross-sectional flow area. The first orifice of the second plurality of orifices may be closer to an inlet of the first conduit than the second orifice of the second plurality of orifices. The second orifice cross-sectional flow area can be greater than the first orifice cross-sectional flow area.

Embodiment 13

The fluid distributor of any one of embodiments 1-8, where a second orifice of the second plurality of orifices may comprise a second orifice cross-sectional flow area. The first orifice of the second plurality of orifices may comprise a first orifice cross-sectional flow area that can be substantially equal to the second orifice cross-sectional flow area.

Embodiment 14

The fluid distributor of any one of embodiments 1-13, where a second orifice of the first plurality of orifices comprises an orifice axis extending perpendicular to the first elongated axis. A third orifice of the first plurality of orifices comprises an orifice axis extending perpendicular to the first elongated axis. The orifice axis of the first orifice of the first plurality of orifices is spaced a first distance from the orifice axis of the second orifice of the first plurality of orifices. The orifice axis of the third orifice of the first plurality of orifices is spaced a second distance from the orifice axis of the second orifice of the first plurality of orifices. The first distance may be substantially equal to the second distance.

Embodiment 15

The fluid distributor of embodiment 14, where the orifice axis of the first orifice of the first plurality of orifices, the orifice axis of the second orifice of the first plurality of orifices, and the orifice axis of the third orifice of the first plurality of orifices extend along a second common plane containing the first elongated axis.

Embodiment 16

The fluid distributor of any one of embodiments 1-13, where the first elongated axis is coincident with the second elongated axis.

Embodiment 17

The fluid distributor of embodiment 16, where a second orifice of the first plurality of orifices comprises an orifice axis extending perpendicular to the first elongated axis. The orifice axis of the first orifice of the first plurality of orifices is spaced a first distance from the orifice axis of the first orifice of the second plurality of orifices. The orifice axis of the second orifice of the first plurality of orifices is spaced a second distance from the orifice axis of the second orifice of the first plurality of orifices. The first distance can be substantially equal to the second distance.

Embodiment 18

The fluid distributor of any one of embodiments 1-13, where a second orifice of the first plurality of orifices comprises a second orifice cross-sectional flow area. The first orifice of the first plurality of orifices may comprise a first orifice cross-sectional flow area. The first orifice of the first plurality of orifices is closer to an inlet of the first conduit than the second orifice of the first plurality of orifices. The second cross-sectional flow area can be greater than the first cross-sectional flow area.

Embodiment 19

The fluid distributor of any one of embodiments 1-13, where a second orifice of the first plurality of orifices comprises a second orifice cross-sectional flow area. The first orifice of the first plurality of orifices comprises a first orifice cross-sectional flow area that can be substantially equal to the second cross-sectional flow area.

Embodiment 20

A method of distributing fluid with the fluid distributor of any one of embodiments 1-19 may comprising flowing the fluid within the first flow area of the first conduit. The method may also comprise flowing the fluid through orifices of the first plurality of orifices. The method may also comprise flowing the fluid through the second flow area of the second conduit. The method may also comprise flowing the fluid through orifices of the second plurality of orifices. The method may also comprise reacting the fluid with a metal to form a product. The method may also comprise depositing the product on a substrate to form a layer of the product on the substrate.

Embodiment 21

The method of distributing fluid of embodiment 20, where a first mass flow rate through the first orifice of the second plurality of orifices is within about 3% of a second mass flow rate through a second orifice in the second plurality of orifices.

Embodiment 22

The method of distributing fluid of embodiment 21, where the first mass flow rate is substantially equal to the second mass flow rate.

Embodiment 23

The method of distributing fluid of any one of embodiments 20-22, where the fluid comprises at least one of argon, neon, helium, krypton.

Embodiment 24

The method of distributing fluid of any one of embodiments 20-23, where the fluid comprises oxygen.

Embodiment 24

The method of distributing fluid of any one of embodiments 20-24, where the fluid comprises nitrogen.

BRIEF DESCRIPTION OF THE DRAWINGS

The above and other features and advantages of embodiments of the present disclosure are better understood when the following detailed description is read with reference to the accompanying drawings, in which:

FIG. 5 shows the normalized mass flow rate through orifices in fluid distributors with different ratios between a combined cross-sectional flow area of a plurality of orifices of a conduit and a flow area of a conduit;

FIG. 6 shows mass flow rate deviations through a first set of second orifices in a first fluid distributor, according the embodiments disclosed herein;

FIG. 7 shows the mass flow rate deviations through a second set of second orifices in a first fluid distributor, according the embodiments disclosed herein;

FIG. 8 shows mass flow rate deviations through a first set of second orifices in a second fluid distributor, according the embodiments disclosed herein; and FIG. 9 shows the mass flow rate deviations through a second set of second orifices in a second fluid distributor, according the embodiments disclosed herein.

DETAILED DESCRIPTION

Figure 1:
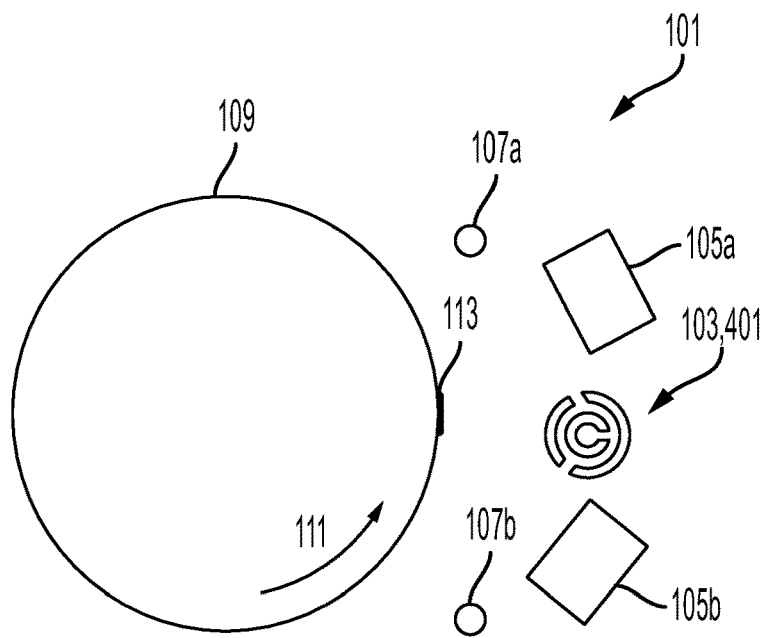
FIG. 1 is a schematic view of a deposition apparatus comprising a fluid distributor, according to one or more embodiments.

Embodiments will now be described more fully hereinafter with reference to the accompanying drawings in which example embodiments are shown. Whenever possible, the same reference numerals are used throughout the drawings to refer to the same or like parts. However, claims may encompass many different aspects of various embodiments and should not be construed as limited to the embodiments set forth herein.

Throughout the disclosure, the drawings are used to emphasize certain aspects. As such, it should not be assumed that the relative size of the different layers, coatings, portions, and substrates shown in the drawings are proportional to its actual relative size, unless explicitly indicated otherwise.

Figure 2:
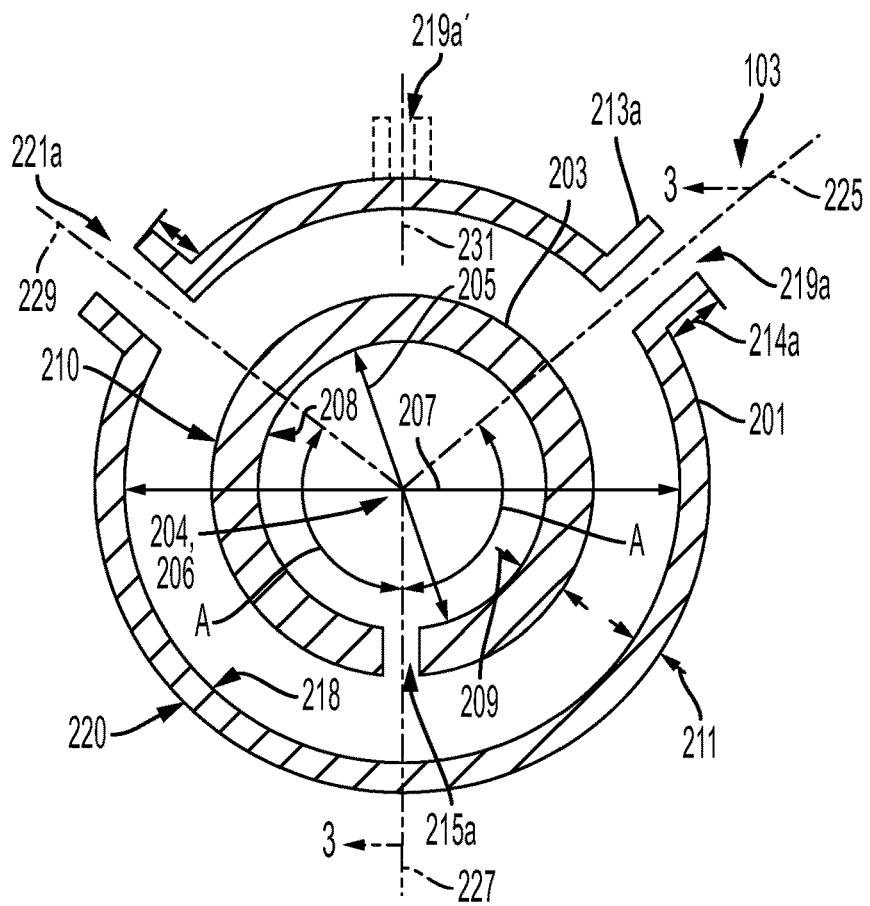
FIG. 2 is cross-sectional view of a fluid distributor, according to one or more embodiments.
Figure 3:
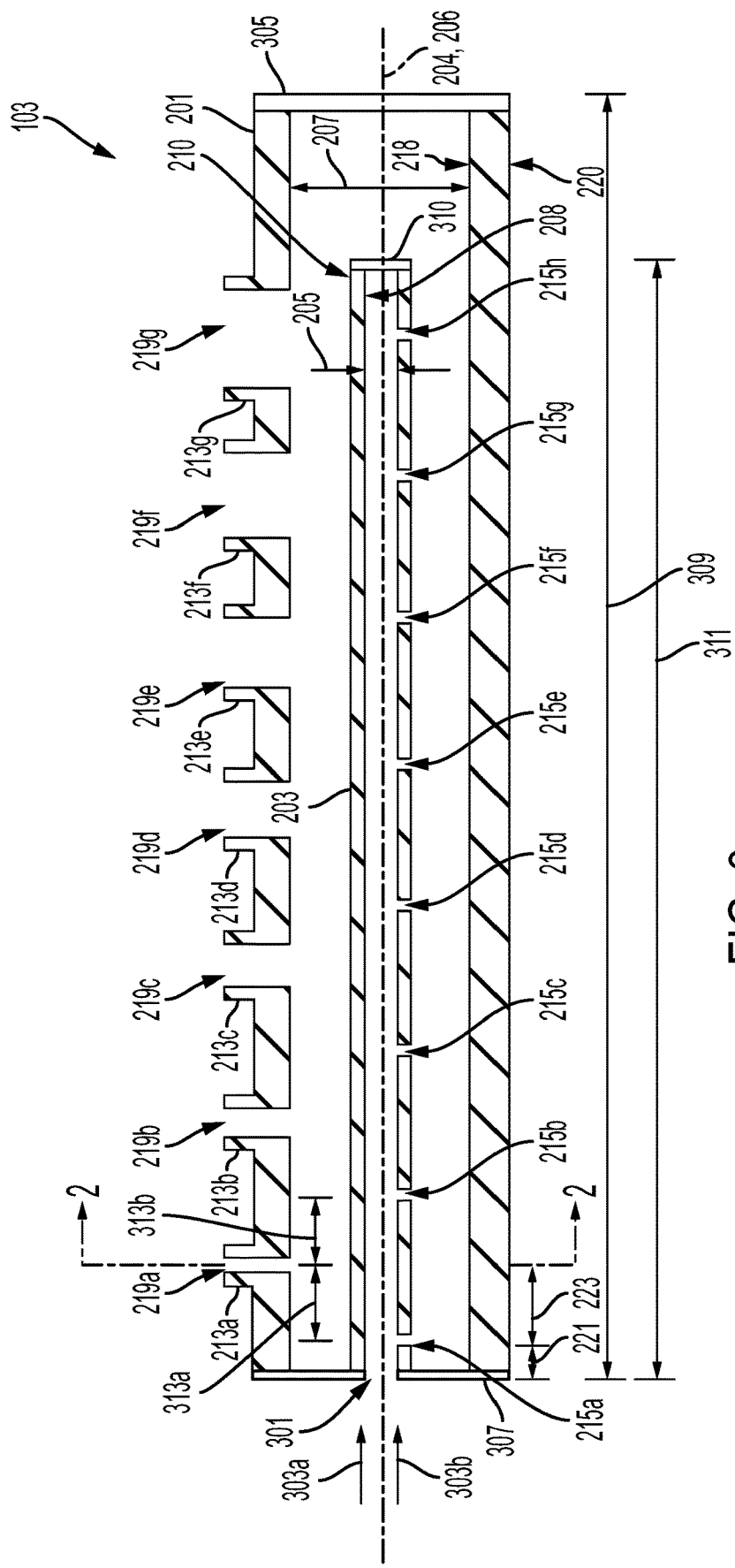
FIG. 3 is a cross-sectional view of a fluid distributor along line 3-3 of FIG. 2, according to one or more further embodiments.
Figure 4:
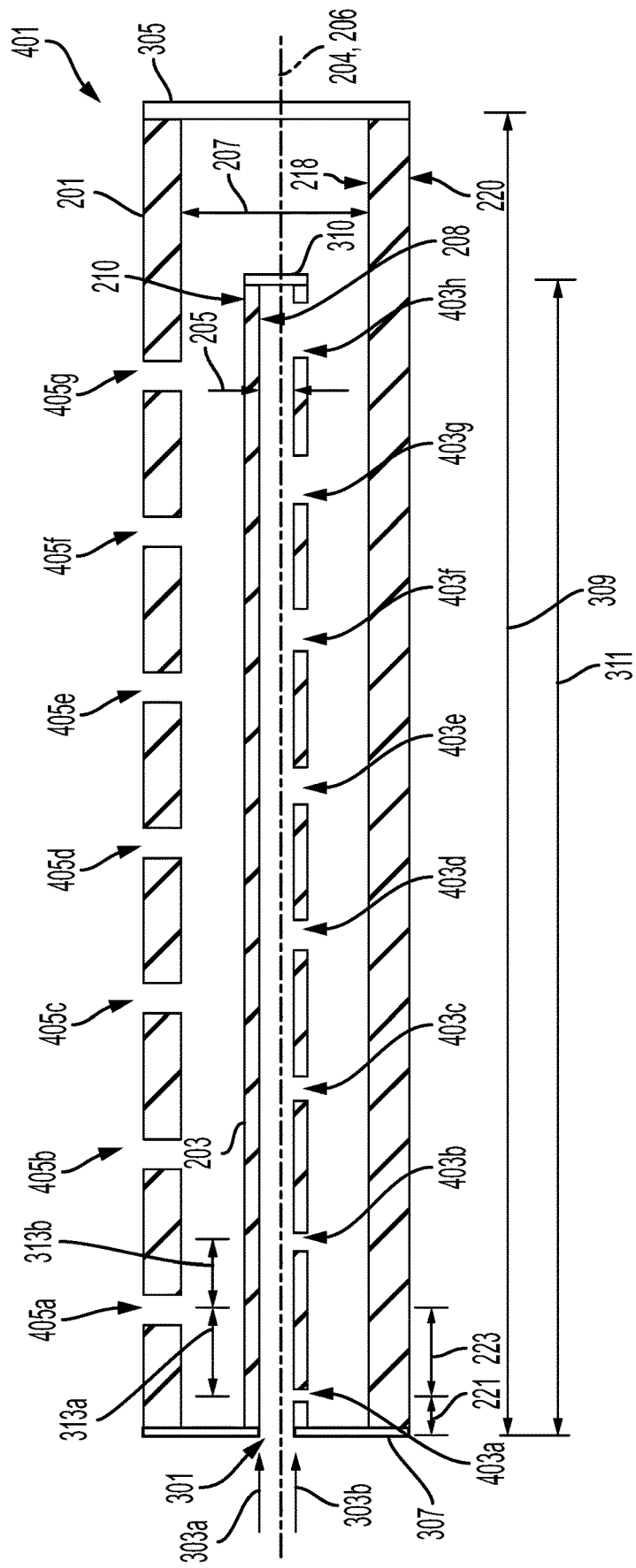
FIG. 4 is a cross-sectional view of a fluid distributor along line 3-3 of FIG. 2, according to other embodiments.

By way of example, FIG. 1 schematically illustrates a deposition apparatus 101. The deposition apparatus 101 comprises a fluid distributor 103, 401. As shown in FIGS. 2-4, the fluid distributor 103, 401 can comprise a first conduit 203 extending along a first elongated axis 204 (extending into and out of the page in FIG. 2) for a first length 311. As shown, the first elongated axis 204 can comprise a central axis of the first conduit 203. In some embodiments, the first length 311 can comprise the overall length of the first conduit 203 and may be about 0.01 meters (m) or more, about 0.1 m or more, about 0.5 m or more, about 10 m or less, about 5 m or less, or about 1 m or less. In some embodiments, the first length 311 may comprise the overall length of the first conduit 203 and may be in a range from 0.01 m to about 10 m, from about 0.01 m to about 5 m, from about 0.01 m to about 1 m from 0.1 m to about 10 m, from about 0.1 m to about 5 m, from about 0.1 m to about 1 m, from about 0.5 m to about 10 m, from about 0.5 m to about 5 m, from about 0.5 m to about 1 m, or any range or subrange therebetween.

Throughout the disclosure, the portion of the first conduit 203 closest to the inlet 301 of the fluid distributor 103, 401 is considered to the be the be beginning of the first conduit 203. As used herein, if a property continuously increases along the length of the first conduit 203, then the property increases as the distance from the inlet 301 of the fluid distributor 103, 401 in the direction of the first elongated axis 204 increases. As shown in FIGS. 2-4, the first conduit 203 comprises an inner surface 208 and an outer surface 210 with a thickness a thickness 209 defined between the inner surface 208 and the outer surface 210 in a direction perpendicular to the first elongated axis 204. In some embodiments, as shown in FIGS. 3-4, the thickness 209 may be substantially the same along the length of the first conduit 203. In other embodiments, although not shown, the thickness 209 of the first conduit 203 may vary along its length. In further embodiments, the thickness 209 of the first conduit 203 may decrease (e.g., monotonically decrease) along its length. In other further embodiments, the thickness 209 of the first conduit 203 may increase (e.g., monotonically increase) along its length. Throughout the disclosure, a value that monotonically increases along a length never decreases; however, the value may increase or alternate between remaining the same and increasing along the length. Throughout the disclosure, a value that monotonically decreases along a length never increases; however, the value may decrease or alternate between remaining the same and decreasing along the length.

In some embodiments, the thickness 209 of the first conduit 203 may be about 0.5 millimeters (mm) or more, about 1 mm or more, about 5 mm or more, about 10 mm or more, about 30 mm or more, about 50 mm or more, about 500 mm or less, or about 100 mm or less. In some embodiments, the thickness 209 of the first conduit 203 may be in a range from about 0.5 mm to about 500 mm, from about 0.5 mm to about 100 mm, from about 1 mm to about 500 mm, from about 1 mm to about 100 mm, from about 5 mm to about 500 mm, from about 5 mm to about 100 mm, from about 10 mm to about 500 mm, from about 10 mm to about 100 mm, from about 30 mm to about 500 mm, from about 30 mm to about 100 mm, from about 50 mm to about 500 mm, from about 50 mm to about 100 mm, or any range or subrange therebetween. In some embodiments, as shown in FIGS. 3-4, there may be a first cap 310 at the end of the first conduit 203 opposite the inlet 301.

The first conduit 203 comprises a width 205 at every point along its length that is perpendicular to the first elongated axis 204. As used herein, the width 205 is the distance between a first point on the inner surface 208 of the first conduit 203 and a second point on the inner surface 208 of the first conduit 203, where the first point and the second point are as far apart as possible and both the first point and the second point are in a common plane perpendicular to the first elongated axis 204. In some embodiments, as shown in FIGS. 3-4, the width 205 may be substantially the same along the length of the first conduit 203. In other embodiments, although not shown, the width of the first conduit 203 may increase (e.g., monotonically increase) along the length of the first conduit 203. In other embodiments, although not shown, the width of the first conduit 203 may decrease (e.g., monotonically decrease) along the length of the first conduit 203. The first conduit 203 comprises a maximum width. As used herein, a maximum width of the first conduit 203 is the greatest value of the width across all the points along the length of the first conduit 203. In some embodiments, the width 205 and/or the maximum width of the first conduit 203 may be about 0.1 mm or more, 0.4 mm or more, about 1 mm or more, about 3 mm or more, about 10 mm or more, about 20 mm or more, about 50 mm or more, about 5 m or less, or about 1 m or less. In some embodiments, the width 205 and/or the maximum width of the first conduit 203 may be in a range from about 0.1 mm to about 5 m, 0.1 mm to about 1 m, from about 0.1 mm to about 5 m, 0.4 mm to about 1 m, from about 1 mm to about 5 m, from about 1 mm to about 1 m, from about 3 mm to about 5 m, from about 3 mm to about 1 m, from about 10 mm to about 5 m, from about 10 mm to about 1 m, from about 20 mm to about 5 m, from about 20 mm to about 1 m, from about 50 mm to about 5 m, from about 50 mm to about 1 m, or any range or subrange therebetween.

In some embodiments, as shown in FIGS. 1-2, the inner surface 208 of the first conduit 203 may comprise a profile perpendicular to the first elongated axis 204 that is circular. In such embodiments, the width 205 and/or maximum width may be a diameter of the circular cross-sectional profile of the inner surface 208. In other embodiments, the inner surface 208 of the first conduit 203 may comprise a profile perpendicular to the first elongated axis 204 that is any closed shape (e.g., triangular, quadrilateral, hexagonal, octagonal, or other polygonal shape). In some embodiments, the outer surface 210 of the first conduit 203 may comprise a profile perpendicular to the first elongated axis 204 that is substantially the same shape as the corresponding profile of the inner surface 208. In some embodiments, the outer surface 210 of the first conduit 203 may comprise a profile perpendicular to the first elongated axis 204 that is any closed shape (e.g., circular, triangular, quadrilateral, hexagonal, octagonal, or any other polygonal shape).

The first conduit 203 comprises a first plurality of orifices 215a-h, 403a-h. In some embodiments, as shown in FIGS. 3-4, the number of orifices in the first plurality of orifices may be 8, although greater or less than 8 orifices may be provided in further embodiments. In some embodiments, as shown in FIGS. 3-4, the first plurality of orifices 215a-h, 403a-h may be contained in a plane containing the first elongated axis 204. The orifice axis of one or more of the first plurality of orifices 215a-h, 403a-h can be perpendicular to the first elongated axis 204 and can contain a point on the first elongated axis 204. As shown in FIGS. 3-4, the orifice axes of all of the first plurality of orifices 215a-h, 403a-h can be perpendicular to the first elongated axis 204 and can contain a point on the first elongated axis 204. In some embodiments, the orifice axis of one or more of the first plurality of orifices 215a-h, 403a-h can comprise a central orifice axis of the orifice. For example, as shown, the orifice axes of all of the first plurality of orifices 215a-h, 403a-h can comprise a central orifice axis of the orifice.

An orifice of the first plurality of orifices 215a-h, 403a-h comprises a corresponding orifice cross-sectional flow area. Throughout the disclosure, a cross-sectional area of an orifice is defined as the area of a cross-section of the corresponding orifice in a plane perpendicular to the corresponding orifice axis. Throughout the disclosure, the orifice cross-sectional flow area is defined as the minimum cross-sectional area of the corresponding orifice of all of the cross-sectional areas for the corresponding orifice along the orifice axis. In some embodiments, as shown in FIGS. 3-4, the cross-sectional area of an orifice may be substantially the same along the corresponding orifice axis. In other embodiments, although not shown, the cross-sectional area of an orifice may increase (e.g., monotonically increase) as the corresponding cross-section is further from the first elongated axis 204. In some embodiments, the orifice can be flared. In other embodiments, although not shown, the cross-sectional area of an orifice may decrease (e.g., monotonically decrease) as the corresponding cross-section is further from the first elongated axis 204. In some embodiments, the orifice can be tapered.

In some embodiments, as shown in FIG. 3, each of the orifices of the first plurality of orifices 215a-h may comprise substantially the same orifice cross-sectional flow area. In other embodiments, as shown in FIG. 4, a first orifice (e.g., 403a) of the first plurality of orifices closer to the inlet 301 of the fluid distributor 401 may have a smaller cross-sectional flow area than a second orifice (e.g., 403h) of the first plurality of orifices further from the inlet 301 of the fluid distributor 401. In further embodiments, as shown in FIG. 4, the orifice cross-sectional flow area of the corresponding orifice may increase (e.g., monotonically increase) as the distance of the corresponding orifice axis from the inlet 301 of the fluid distributor 401 increases. Throughout the disclosure, the first combined cross-sectional flow area is defined as the sum of the orifice cross-sectional flow area of each orifice in the first plurality of orifices. For example, with reference to FIG. 3, the first combined cross-sectional flow area is equal to the sum of the orifice cross-sectional flow area of each orifice of the first plurality of orifices 215a-h.

In some embodiments, as shown in FIGS. 3-4, a first distance between an orifice axis of a first orifice (e.g., 215a, 403a) of the first plurality of orifices 215a-h, 403a-h and an orifice axis of a second orifice (e.g., 215b, 403b) of the first plurality of orifices 215a-h, 403a-h adjacent to the first orifice may be substantially equal to a second distance between the orifice axis of the second orifice (e.g. 215b, 403b) and an orifice axis of a third orifice (e.g., 215c, 403c) of the first plurality of orifices 215a-h, 403a-h adjacent to the second orifice. In further embodiments, as shown in FIGS. 3-4, the distance between every pair of orifice axes corresponding to pairs of adjacent orifices in the first plurality of orifices 215a-h, 403a-h may be substantially equal. In other embodiments, although not shown, the distance between orifices axes corresponding to adjacent orifices in the first plurality of orifices may decrease (e.g., monotonically decrease) as a distance between the pair of orifice axes of the adjacent orifices and the inlet 301 of the fluid distributor 103, 401 increases. In other embodiments, although not shown, the distance between orifices axes corresponding to adjacent orifices in the first plurality of orifices may increase (e.g., monotonically increase) as a distance between the pair of orifice axes of the adjacent orifices and the inlet 301 of the fluid distributor 103, 401 increases. In further embodiments, a first distance between an orifice axis of a first orifice of the first plurality of orifices and an orifice axis of a second orifice of the first plurality of orifices adjacent to the first orifice may be less than a second spacing between the orifice axis of the second orifice and an orifice axis of a third orifice of the first plurality of orifices adjacent to the second orifice, where the orifice axis of the first orifice is closer to the inlet 301 of the fluid distributor 103, 401 than the orifice axis of the third orifice.

Throughout the disclosure, the cross-sectional area of the first conduit 203 is defined as the area of a cross-section of the first conduit 203 bounded by the inner surface 208 and/or a projection of the inner surface 208 across the entrance of one or more orifices of the first plurality of orifices in a plane perpendicular to the first elongated axis 204. Throughout the disclosure, the first cross-sectional flow area is defined as the cross-sectional area of the first conduit 203 for a plane closest to the inlet 301 of the fluid distributor 103, 401 that contains an orifice axis of an orifice of the first plurality of orifices. For example, with reference to FIG. 3, the first cross-sectional flow area is the cross-sectional area of the first conduit 203 measured in a plane perpendicular to the first elongated axis 204, where the plane contains the orifice axis of the orifice 215a of the first plurality of orifices 215a-h closest to the inlet 301 of the fluid distributor 103. In some embodiments, the first cross-sectional flow area may be about 0.08 $mm^2$ or more, about 0.8 $mm^2$ or more, about 8 $mm^2$ or more, about 80 $mm^2$ or more, about 800 $mm^2$ or more, about 80 $m^2$ or less, about 8 $m^2$ or less, or about 1 $m^2$ or less. In some embodiments, the first cross-sectional flow area may be in a range from about 0.08 $mm^2$ to about 80 $m^2$, from about 0.08 $mm^2$ to about 8 $m^2$, from about 0.08 $mm^2$ to about 1 $m^2$, from about 0.8 $mm^2$ to about 80 $m^2$, from about 0.8 $mm^2$ to about 8 $m^2$, from about 0.8 $mm^2$ to about 1 $m^2$, from about 8 $mm^2$ to about 80 $m^2$, from about 8 $mm^2$ to about 8 $m^2$, from about 8 $mm^2$ to about 1 $m^2$, from about 80 $mm^2$ to about 80 $m^2$, from about 80 $mm^2$ to about 8 $m^2$, from about 80 $mm^2$ to about 1 $m^2$, from about 800 $mm^2$ to about 80 $m^2$, from about 800 $mm^2$ to about 8 $m^2$, from about 800 $mm^2$ to about 1 $m^2$, or any range or subrange therebetween.

Throughout the disclosure, a first ratio is defined as the first cross-sectional flow area (of the first conduit 203) divided by the first combined cross-sectional flow area (of the first plurality of orifices). In some embodiments, the first ratio may be about 2 or more, about 2.5 or more, about 3 or more, about 4 or more, about 5 or more, about 100 or less, about 20 or less, or about 10 or less. In some embodiments, the first ratio can be in a range from about 2 to about 100, from about 2 to about 20, from about 2 to about 10, from about 2.5 to about 100, from about 2.5 to about 20, from about 2.5 to about 10, 3 to about 100, from about 3 to about 20, from about 3 to about 10, from about 4 to about 100, from about 4 to about 20, from about 4 to about 10, from about 5 to about 100, from about 5 to about 20, from about 5 to about 10, or any range or subrange therebetween.

The fluid distributor 103, 401 further comprises a second conduit 201. As shown in FIGS. 1-4, the second conduit 201 circumscribes the first conduit 203. As shown in FIGS. 3-4, the second conduit extends for a second length 309 along a second elongated axis 206. As shown, the second elongated axis 206 can comprise a central axis of the second conduit 201. In some embodiments, although not shown, the second length 309 may be equal to the first length 311. In other embodiments, shown in FIGS. 3-4, the second length 309 of the second conduit 201 may be greater than the first length 311 of the first conduit 203. In such embodiments, as shown in FIGS. 3-4, it can be preferable to cap 310 the first conduit. In further embodiments, the second length 309 may be greater than the first length 311 by about 1 mm or more, about 10 mm or more, about 100 mm or more, about 5 m or less, about 2 m or less, about 1 m or less. In further embodiments, the difference between the second length 309 and the first length 311 may be in a range from about 1 mm to about 5 m, from about 1 mm to about 2 m, from about 1 mm to about 1 mm, from about 10 mm to about 5 m, from about 10 mm to about 2 m, from about 10 mm to about 1 m, from about 100 mm to about 5 m, from about 100 mm to about 2 mm, from about 100 mm to about 1 mm, or any ranges and subranges therebetween. In some embodiments, as shown in FIGS. 3-4, there may be a second cap 305 at the end of the second conduit 201 opposite the inlet 301. In some embodiments, as shown in FIGS. 3-4, there may be a third cap 307 at the end of the second conduit 201 that is closest to or, as shown, defines the inlet 301. In further embodiments, the first elongated axis 204 may be parallel with the second elongated axis 206.

In some embodiments, as shown in FIGS. 2-4, the first elongated axis 204 may be coincident with the second elongated axis 206. In other embodiments, the first elongated axis 204 may not be coincident with the second elongated axis 206 but may extend at an angle relative to the second elongated axis 206 wherein an angle of greater than 0° exists between the first elongated axis 204 and the second elongated axis 206. In further embodiments, an angle between the first elongated axis 204 and the second elongated axis 206 may be about 1° or more, about 2° or more, about 5° or more, about 30° or less, about 20° or less, or about 10°. In further embodiments, an angle between the first elongated axis 204 and the second elongated axis 206 can be in a range from greater than 0° to about 30°, from greater than 0° to about 20°, from greater than 0° to about 10°, from about 1° to about 30°, from about 1° to about 20°, from about 1° to about 10°, from about 2° to about 30°, from about 2° to about 20°, from about 2° to about 10°, from about 5° to about 30°, from about 5° to about 20°, from about 5° to about 10°, or any range or subrange therebetween. In other further embodiments, the angle between the first elongated axis 204 and the second elongated axis 206 may be less than about 1°.

As used herein, if a property continuously increases along the length of the second conduit 201, then the property increases as the distance from the inlet 301 of the fluid distributor 103, 401 increases. As shown in FIGS. 2-4, the second conduit 201 comprises an inner surface 218 and an outer surface 220 with a thickness a thickness 211 defined between the inner surface 218 and the outer surface 220 in a direction perpendicular to the second elongated axis 206. In some embodiments, as shown in FIGS. 3-4, the thickness 211 may be substantially the same along the length of the second conduit 201. In other embodiments, although not shown, the thickness 211 of the second conduit 201 may vary along its length. In further embodiments, the thickness 211 of the second conduit 201 may decrease (e.g., monotonically decrease) along its length. In other further embodiments, the thickness 211 of the second conduit 201 may increase (e.g., monotonically increase) along its length. In some embodiments, the thickness 211 of the second conduit 201 may be about 0.5 millimeters (mm) or more, about 1 mm or more, about 5 mm or more, about 10 mm or more, about 30 mm or more, about 50 mm or more, about 500 mm or less, or about 100 mm or less. In some embodiments, the thickness 211 of the second conduit 201 may be in a range from about 0.5 mm to about 500 mm, from about 0.5 mm to about 100 mm, from about 1 mm to about 500 mm, from about 1 mm to about 100 mm, from about 5 mm to about 500 mm, from about 5 mm to about 100 mm, from about 10 mm to about 500 mm, from about 10 mm to about 100 mm, from about 30 mm to about 500 mm, from about 30 mm to about 100 mm, from about 50 mm to about 500 mm, from about 50 mm to about 100 mm, or any range or subrange therebetween.

The second conduit 201 comprises a width 207 at every point along its length that is perpendicular to the second elongated axis 206. As used herein, the width 207 is the distance between a first point on the inner surface 218 of the second conduit 201 and a second point on the inner surface 218 of the second conduit 201, where the first point and the second point are as far apart as possible and both the first point and the second point are in a common plane perpendicular to the second elongated axis 206. In some embodiments, as shown in FIGS. 3-4, the width 207 may be substantially the same along the length of the second conduit 201. In other embodiments, although not shown, the width of the second conduit 201 may increase (e.g., monotonically increase) along the length of the second conduit 201. In other embodiments, although not shown, the width of the second conduit 201 may decrease (e.g., monotonically decrease) along the length of the second conduit 201. The second conduit 201 comprises a maximum width. As used herein, a maximum width of the second conduit 201 is the greatest value of the width 207 across all the points along the length of the second conduit 201. The maximum width of the second conduit 201 is greater than the maximum width of the first conduit 203 in order for the second conduit 201 to circumscribe the first conduit 203. In some embodiments, the width 207 and/or the maximum width of the second conduit 201 may be about 1 mm or more, about 3 mm or more, about 10 mm or more, about 20 mm or more, about 50 mm or more, about 5 m or less, or about 1 m or less. In some embodiments, the width 207 and/or the maximum width of the second conduit 201 may be in a range from about 1 mm to about 5 m, from about 1 mm to about 1 m, from about 3 mm to about 5 m, from about 3 mm to about 1 m, from about 10 mm to about 5 m, from about 10 mm to about 1 m, from about 20 mm to about 5 m, from about 20 mm to about 1 m, from about 50 mm to about 5 m, from about 50 mm to about 1 m, or any range or subrange therebetween.

In some embodiments, as shown in FIGS. 1-2, the inner surface 218 of the second conduit 201 may comprise a profile perpendicular to the second elongated axis 206 that is circular. In such embodiments, the width 207 and/or maximum width may be a diameter of the circular cross-sectional profile of the inner surface 218. In other embodiments, the inner surface 218 of the first conduit 203 may comprise a profile perpendicular to the second elongated axis 206 that is any closed shape (e.g., triangular, quadrilateral, hexagonal, octagonal, or any other polygonal shape). In some embodiments, the outer surface 220 of the second conduit 201 may comprise a profile perpendicular to the second elongated axis 206 that is substantially the same shape as the corresponding profile of the inner surface 218. In some embodiments, the outer surface 220 of the second conduit 201 may comprise a profile perpendicular to the second elongated axis 206 that is any closed shape (e.g., circular, triangular, quadrilateral, hexagonal, octagonal, or any other polygonal shape).

The second conduit 201 comprises a second plurality of orifices 219a-g, 221a, 405a-g. In some embodiments, as shown in FIG. 3, the second plurality of orifices can comprise a first set of orifices 219a-g that may be contained in a plane containing the second elongated axis 206. In some embodiments, as shown in FIGS. 3-4, the number of orifices in a first set of the second plurality of orifices may be 7 although the first set of the second plurality of orifices may comprise greater than or less than 7 orifices in further embodiments. In some embodiments, the orifice axis of one or more of the second plurality of orifices 219a-g, 221a, 405a-g can be perpendicular to the second elongated axis 206 and can contain a point on the second elongated axis 206. For example, as shown, the orifice axes of all of the second plurality of orifices 219a-g, 221a, 405a-g can be perpendicular to the second elongated axis 206 and can contain a point on the second elongated axis 206. In some embodiments, the orifice axis of one or more of the second plurality of orifices 219a-g, 221a, 405a-g can comprise a central orifice axis of the orifice. For example, as shown, the orifice axes of all of the second plurality of orifices 219a-g, 221a, 405a-g can comprise a central orifice axis of the orifice.

An orifice of the second plurality of orifices 219a-g, 221a, 405a-g comprises a corresponding orifice cross-sectional flow area. In some embodiments, as shown in FIG. 4, the orifices of the second plurality of orifices 405a-g may comprise substantially the same orifice cross-sectional flow area. In other embodiments, as shown in FIG. 3, a first orifice (e.g., 219a) of the second plurality of orifices 219a-g closer to the inlet 301 of the fluid distributor 103 may have a smaller cross-sectional flow area than a second orifice (e.g., 219b) of the plurality second orifices 219a-g further from the inlet 301 of the fluid distributor 103 than the first orifice 219a. In further embodiments, as shown in FIG. 3, the orifice cross-sectional flow area may increase (e.g., monotonically increase) as the distance of the corresponding orifice axis of each orifice of the plurality second orifices 219a-g increases from the inlet 301 of the fluid distributor 103. Throughout the disclosure, a second combined cross-sectional flow area is defined as the sum of the orifice cross-sectional flow area of each orifice in the second plurality of orifices.

Throughout the disclosure, a second ratio is defined as the first combined cross-sectional flow area of the first plurality of orifices divided by the second combined cross-sectional flow area of the second plurality of orifices. In some embodiments, the second ratio may be about 2 or more, 3 or more, about 4 or more, about 5 or more, about 100 or less, about 20 or less, or about 10 or less. In some embodiments, the first ratio can be in a range from about 2 to about 100, about 2 to about 20, about 2 to about 10, about 3 to about 100, from about 3 to about 20, from about 3 to about 10, from about 4 to about 100, from about 4 to about 20, from about 4 to about 10, from about 5 to about 100, from about 5 to about 20, from about 5 to about 10, or any range or subrange therebetween.

In some embodiments, as shown in FIGS. 2-3, one or more orifices of the second plurality of orifices 219a-g, 221a may comprise an extension 213a-g that increases the length of the orifice by an extension length 214a (see FIG. 2) beyond the thickness 211 of the second conduit 201. In some embodiments, the extension length 214a may be about 1 mm or more, 10 mm or more, 40 mm or more, 1,000 mm or less, 100 mm or less, or 60 mm or less. In some embodiments, the extension length 214a may be in a range from about 1 mm to about 1,000 mm, from about 1 mm to about 100 mm, from about 1 mm to about 60 mm, from about 10 mm to about 1,000 mm, from about 10 mm to about 100 mm, from about 10 mm to about 60 mm, from about 40 mm to about 1,000 mm, from about 40 mm to about 100 mm, from about 40 mm to about 60 mm, or any range or subrange therebetween. In other embodiments, one or more of the orifices of the second plurality of orifices 405*a*-*g* may not have an extension. For example, as shown in FIG. 4, none of the orifices of the second plurality of orifices 405*a*-*g* have an extension. It is to be understood the presence or absence of an extension 213*a*-*g* can be combined with the relationships between the orifices of the first plurality of orifices (e.g., equal distance, increasing, monotonically increasing, decreasing, monotonically decreasing) discussed above.

In some embodiments, as shown in FIGS. 3-4, a first distance between an orifice axis of a first orifice (e.g., 219*a*, 405*a*) of the first set of orifices 219*a*-*g*, 405*a*-*g* of the second plurality of orifices 219*a*-*g*, 221*a*, 403*a*-*g* and an orifice axis of a second orifice (e.g., 219*b*, 405*b*) of the first set of orifices 219*a*-*g*, 405*a*-*g* of the second plurality of orifices 219*a*-*g*, 221*a*, 405*a*-*g* adjacent to the first orifice in a direction of the second elongated axis 206 may be substantially equal to a second distance between the orifice axis of the second orifice (e.g. 219*b*, 405*b*) and an orifice axis of a third orifice (e.g., 219*c*, 405*c*) of the first set of orifices 219*a*-*g*, 405*a*-*g* of the second plurality of orifices 219*a*-*g*, 221*a*, 405*a*-*g* adjacent to the second orifice in a direction of the second elongated axis 206. In further embodiments, as shown in FIGS. 3-4, the distance between a pair of orifice axes corresponding to pairs of adjacent orifices in the first set of orifices 219*a*-*g*, 405*a*-*g* of the second plurality of orifices 219*a*-*g*, 221*a*, 405*a*-*g* may be substantially equal. In other embodiments, although not shown, the distance between orifices axes corresponding to adjacent orifices in the first set of orifices in the second plurality of orifices may decrease (e.g., monotonically decrease) as a distance between the pair of orifice axes of the adjacent orifices and the inlet 301 of the fluid distributor 103, 401 increases. In other embodiments, although not shown, the distance between orifices axes corresponding to adjacent orifices in the first set of orifices in the second plurality of orifices may increase (e.g., monotonically increase) as a distance between the pair of orifice axes of the adjacent orifices and the inlet 301 of the fluid distributor 103, 401 increases. In further embodiments, a first distance between an orifice axis of a first orifice of the first set of orifices of the second plurality of orifices and an orifice axis of a second orifice of the first set of orifices of the second plurality of orifices adjacent to the first orifice may be less than a second spacing between the orifice axis of the second orifice and an orifice axis of a third orifice of the first set of orifices the second plurality of orifices adjacent to the second orifice, where the orifice axis of the first orifice is closer to the inlet 301 of the fluid distributor 103, 401 than is the orifice axis of the third orifice. It should be understood that the different relationships between the orifices in the first set of orifices of the second plurality of orifices (e.g., equal distance, increasing, monotonically increasing, decreasing, monotonically decreasing) can be combined with different relationships between the orifices of the first plurality of orifices (e.g., equal distance, increasing, monotonically increasing, decreasing, monotonically decreasing) and the presence or absence of an extension 213*a*-*g*, as discussed above.

In some embodiments, as shown in FIG. 2 in the dashed lines and indicated at 219*a*', the second plurality of orifices 219*a*-*g* may only comprise a first set of orifices. Alternatively, in some embodiments, as shown in FIGS. 1-2 in the solid lines, the second plurality of orifices 219*a*-*g*, 221*a*, 405*a*-*g* may further comprise a second set of orifices. In some embodiments, as shown in FIGS. 1-2, an orifice 221*a* of the second set of orifices may be at substantially the same location on the second elongated axis 206 as an orifice 219*a* of the first set of orifices 219*a*-*g*. In further embodiments, as shown in FIGS. 1-2, a first orifice 219*a* of the first set of orifices 219*a*-*g* may be in a common plane with a second orifice 221*a* of the second set of orifices 221*a*, where the common plane is perpendicular to the second elongated axis 206.

In further embodiments, although not shown, each orifice of the set of orifices including the orifice 221*a* may be at substantially the same location on the second elongated axis 206 as a corresponding orifice of the first set of orifices 219*a*-*g*. In further embodiments, the number of orifices in the second set of orifices comprising the orifice 221*a* may be the same as the number of orifices in the first set of orifices 219*a*-*g*. In other embodiments, the number of orifices in the second set of orifices comprising the orifice 221*a* may be less than the number of orifices in the first set of orifices 219*a*-*g*. In some embodiments, an orifice of the second set of orifices may be staggered along the second elongated axis 206 from an orifice of the first set of orifices. In some embodiments, although not shown, the second plurality of orifices may comprise more than two sets of orifices.

Throughout the disclosure, an angle between an orifice axis of a first orifice and an orifice axis of a second orifice is defined as the smallest angle (i.e., from 0° to 180°) between the orifice axes. For example, with reference to FIG. 2, an angle between an orifice 219*a* of the first set of orifices of the second plurality of orifices 219*a*-*g*, 221*a* and an orifice 221*a* of the second set of orifices of the second plurality of orifices 219*a*-*g*, 221*a* is defined as the angle between the orifice axis of the orifice 219*a* of the first set of orifices and the orifice axis of the orifice 221*a* of the second set of orifices. In some embodiments, the angle between the orifice axis of the orifice 219*a* of the first set of orifices and the orifice axis of the orifice 221*a* of the second set of orifices can be about 15° or more, about 30° or more, about 45° or more, about 60° or more, about 75° or more, about 90° or more, about 180° or less, about 165° or less, about 150° or less, or about 135° or less. In some embodiments, the angle between the orifice axis of the orifice 219*a* of the first set of orifices and the orifice axis of the orifice 221*a* of the second set of orifices can be in a range from about 45° to about 180°, from about 45° to about 165°, from about 45° to about 150°, from about 45° to about 135°, from about 60° to about 180°, from about 60° to about 165°, from about 60° to about 150°, from about 60° to about 135°, from about 75° to about 180°, from about 75° to about 165°, from about 75° to about 150°, from about 75° to about 135°, from about 90° to about 180°, from about 90° to about 165°, from about 90° to about 150°, from about 90° to about 135°, or any range or subrange therebetween. In further embodiments, the angle between each orifice of the first set of orifices 219*a*-*g* and the corresponding orifice of the second set of orifices containing the orifice 221*a* can be within the ranges set forth above and may be identical to one another. In some embodiments, the angle between orifices of the second plurality or orifices 219*a*-*g*, 221*a*, 405*a*-*g* may be determined by the arrangement of the rest of the deposition apparatus 101.

Throughout the disclosure, a second cross-sectional flow area of the second conduit 201 is defined as a cross section of a second flow area bound between: (1) the inner surface 218 of the second conduit 201 and/or a projection of the inner surface 218 across the entrance of one or more orifices of the second plurality of orifices 219*a*-*g*, 221*a*, 405*a*-*g* in a plane perpendicular to the second elongated axis 206, and (2) the outer surface 210 of the first conduit 203 and/or a projection of the outer surface 210 across the exit of one or more orifices of the first plurality of orifices 215a-h, 403a-h in a plane perpendicular to the first elongated axis 204. Throughout the disclosure, the second cross-sectional flow area is defined as the cross-sectional area of the second conduit 201 for a plane closest to the inlet 301 of the fluid distributor 103, 401 that contains an orifice axis of an orifice of the first plurality of orifices. For example, with reference to FIG. 3, the second cross-sectional flow area is the cross-sectional area bound between the first conduit 203 and the second conduit 201 measured in a plane perpendicular to the second elongated axis 206, where the plane contains the orifice axis of the orifice 215a of the first plurality of orifices 215a-h closest to the inlet 301 of the fluid distributor 103.

In some embodiments, the second cross-sectional flow area may be about 0.03 mm$^2$ or more, about 0.3 mm$^2$ or more, about 3 mm$^2$ or more, about 30 mm$^2$ or more, about 300 mm$^2$ or more, about 30 m$^2$ or less, about 3 m$^2$ or less, or about 1 m$^2$ or less. In some embodiments, the first cross-sectional flow area may be in a range from about 0.03 mm$^2$ to about 30 m$^2$, from about 0.03 mm$^2$ to about 3 m$^2$, from about 0.03 mm$^2$ to about 1 m$^2$, from about 0.3 mm$^2$ to about 30 m$^2$, from about 0.3 mm$^2$ to about 3 m$^2$, from about 0.3 mm$^2$ to about 1 m$^2$, from about 3 mm$^2$ to about 30 m$^2$, from about 3 mm$^2$ to about 3 m$^2$, from about 3 mm$^2$ to about 1 m$^2$, from about 30 mm$^2$ to about 30 m$^2$, from about 30 mm$^2$ to about 3 m$^2$, from about 30 mm$^2$ to about 1 m$^2$, from about 300 mm$^2$ to about 30 m$^2$, from about 300 mm$^2$ to about 3 m$^2$, from about 300 mm$^2$ to about 1 m$^2$, or any range or subrange therebetween.

As shown in FIG. 2, an angle "A" between an orifice axis 227 a first orifice 215a of the first plurality of orifices 215a-h and an orifice axis 225, 229 of a second orifice 219a, 221a of the second plurality of orifices 219a-g, 221a can be about 15° or more, about 30° or more, about 45° or more, about 60° or more, about 75° or more, about 90° or more, about 180° or less, about 165° or less, about 150° or less, or about 135° or less. In further embodiments, the angle "A" can be in a range from about 45° to about 180°, from about 45° to about 165°, from about 45° to about 150°, from about 45° to about 135°, from about 60° to about 180°, from about 60° to about 165°, from about 60° to about 150°, from about 60° to about 135°, from about 75° to about 180°, from about 75° to about 165°, from about 75° to about 150°, from about 75° to about 135°, from about 90° to about 180°, from about 90° to about 165°, from about 90° to about 150°, from about 90° to about 135°, or any range or subrange therebetween. A similar angle "A" may also exist between the orifice axis of any of the orifices 219a-g and an orifice axis of any of the orifices 215a-h. Still further, a similar angle "A" may also exist between the orifice axis of an orifice of the second set of orifices 221a of the second plurality of orifices 219a-g, 221a, 405a-g and an orifice axis of an orifice of the first plurality of orifices 403a-h. In some further embodiments, the similar angle "A" for the first set of orifices 405a-g may be different than the angle "A" of the second set of orifices 221a. In other further embodiments, the similar angle "A" for the first set of orifices 405a-g may be substantially the same as the angle "A" of the second set of orifices 221a. In other embodiments, as shown in FIG. 2 in dashed lines, the angle between the orifice axis 227 of the orifice 215a or the first plurality of orifices 215a-h, 403a-h and the orifice 219a' of a second plurality of orifices can be about 180° and/or within a range from about 45° to about 180° or from about 170° to about 180°.

In some embodiments, as shown in FIGS. 3-4, an orifice axis of an orifice of the first plurality of orifices 215a-h, 403a-h may be staggered with respect to an orifice axis of an orifice of the second plurality of orifices 219a-g, 405a-g in the direction of the first elongated axis 204 and/or second elongated axis 206 by a stagger distance 223. In even further embodiments, the stagger distance 223 may be about 10 mm or more, about 30 mm or more, about 500 mm or less, about 200 mm or less, about 100 mm or less, or about 50 mm or less. In even further embodiments, the stagger distance may be in a range from about 10 mm to about 500 mm, from about 10 mm to about 200 mm, from about 10 mm to about 50 mm, from about 30 mm to about 500 mm, from about 30 mm to about 200 mm, from about 30 mm to about 50 mm, or any range or subrange therebetween. In some embodiments, as shown in FIGS. 3-4, an orifice 215a of the first plurality of orifices 215a-h closest to the inlet 301 of the fluid distributor 103, 401 may be offset from the inlet 301 of the fluid distributor 103, 401 by an offset distance 221. In some embodiments, the offset distance 221 may be about 1 mm or more, about 10 mm or more, about 40 mm or more, about 200 mm or less, about 100 mm or less, or about 80 mm or less. In some embodiments, the offset distance 221 may be in arrange from about 1 mm to about 200 mm, from about 1 mm to about 100 mm, from about 1 mm to about 80 mm, from about 10 mm to about 200 mm, from about 10 mm to about 100 mm, from about 10 mm to about 80 mm, from about 40 mm to about 200 mm, from about 40 mm to about 100 mm, from about 40 mm to about 80 mm, or any range or subrange therebetween.

In some embodiments, as shown in FIGS. 3-4, a first distance 313a between an orifice axis of a first orifice (e.g., 215a, 403a) of the first plurality of orifices 215a-h, 403a-h and an orifice axis of a second orifice (e.g., 219a, 405a) of the second plurality of orifices 219a-g, 221a, 405a-g adjacent to the first orifice may be substantially equal to a second distance 313b between the orifice axis of the second orifice (e.g. 219b, 405b) and an orifice axis of a third orifice (e.g., 215c, 403c) of the first plurality of orifices 215a-h, 403a-h adjacent to the second orifice. In further embodiments, although not shown, the distance between every pair of orifice axes corresponding to pairs of adjacent orifices in the first plurality of orifices 215a-h, 403a-h may be bisected by at least one orifice of the second plurality of orifices 219a-g, 221a, 405a-g, meaning that an orifice of the second plurality of orifices 219a-g, 221a, 405a-g is equally spaced from a pair of adjacent orifices of the first plurality of orifices 215a-h, 403a-h.

As shown in FIGS. 1-4, in some embodiments, providing the fluid distributor 103, 401 with the first cap 310 on the first conduit 203, the second cap 305 on the second conduit 201, and the third cap 307 on the second conduit may promote a more uniform pressure distribution throughout the second flow area, which further promotes a more uniform distribution of material exiting the second conduit 201 through the second plurality of orifices 219a-g, 221a, 405a-g.

In some embodiments, the first conduit 203 and the second conduit 201 may comprise the same material although the first and second conduits may be comprised of different materials in further embodiments. The materials of the conduits may comprise any material that is compatible with the fluid to be distributed by the fluid distributor 103. For instance, the material of the first conduit 203 and/or the second conduit 201 may comprise metal, plastic, or glass-based materials. Examples of suitable metal materials include cast iron, wrought iron, lacquered iron, carbon steel, stainless steel, galvanized steel, chrome plated brass, aluminum, copper, titanium, and lead. Examples of suitable polymers comprise, without limitation, the following including copolymers and blends thereof: thermoplastics including polystyrene (PS), polycarbonate (PC), polyesters including polyethyleneterephthalate (PET) or polyoxymethylene (POM), polyolefins including polyethylene (PE), polyvinylchloride (PVC), acrylic polymers including polymethyl methacrylate (PMMA), thermoplastic urethanes (TPU), polyetherimide (PEI), epoxies, and silicones including polydimethylsiloxane (PDMS). As used herein, "glass-based" includes both glasses and glass-ceramics, wherein glass-ceramics have one or more crystalline phases and an amorphous, residual glass phase. Glass-based materials may comprise an amorphous material (e.g., glass) and optionally one or more crystalline materials (e.g., ceramic). Amorphous materials and glass-based materials may be thermally or chemically strengthened. Examples of glass-based materials, which may be free of lithia or not, comprise soda lime glass, alkali aluminosilicate glass, alkali containing borosilicate glass, alkali alumniophosphosilicate glass, and alkali aluminoborosilicate glass. It may be preferable to use a material that is corrosion resistant and non-reactive with the fluids to be flowed through the fluid distributor 103, 401. As such, preferable first materials (of the first conduit) and/or second materials (of the second conduit) may include ultra-high molecular weight polyethylene (UHMWPE), cross-linked polyethylene (PEX), and chlorinated PVC (CPVC), and lacquered iron.

In some embodiments, an orifice can be generated in a conduit using molding techniques. In other embodiments, an orifice can be generated in a conduit using hot embossing. In still other embodiments, an orifice can be generated in a conduit using a drill, rotary blade, or reciprocating blade. In such embodiments, it may be preferable to remove any residual material at the edges of the created orifice using a deburring technique. In yet other embodiments, an orifice can be generated using a laser cutting technique.

A mixture of fluids may be fed into the inlet 301 of the fluid distributor 103, 401. Examples of fluids include liquids and gases. Gases may comprise a carrier gas 303a, a reactant gas 303b, and optionally a metallic gas. In some embodiments, a carrier gas 303a may comprise a non-reactive gas, for example, argon, neon, helium, or krypton. In some embodiments, a reactant gas 303b may comprise a gas rich in oxygen, for example, diatomic oxygen, a nitrous oxide (e.g., dinitrogen oxide, nitrogen dioxide, etc.), water vapor, hydrogen peroxide, and carbon dioxide. In some embodiments, a reactant gas 303b may comprise a gas rich in nitrogen, for example, diatomic nitrogen, a nitrous oxide (e.g., dinitrogen oxide, nitrogen dioxide, etc.), urea, and ammonium nitrate. In further embodiments, it may be desirable for the reactant gas 303b to be rich in both oxygen and nitrogen, for example, diatomic oxygen, diatomic nitrogen, and/or a nitrous oxide (e.g., dinitrogen oxide, nitrogen dioxide, etc.). Optionally, in some embodiments, a metallic gas may include silane, aluminum hydride, titanium hydride, magnesium hydride, silicon vapor, aluminum vapor, titanium vapor, and magnesium vapor. In embodiments without a metallic gas, a metal source 107a, 107b will preferably be present, as discussed below.

In some embodiments, as shown in FIG. 1, the second plurality of orifices 219a-g, 221a, 405a-g of the fluid distributor 103, 401 will face an ionizer 105a, 105b. The ionizer 105a, 105b may comprise an inductively coupled plasma, one or more laser beams tuned to absorption spectra of the reactant gas 303b and/or metallic gas, or an electron beam. In embodiments with a metallic gas, the ionized reactant gas and metallic gases will react to form a product in the gas phase that can be deposited. In embodiments without a metallic gas, as shown in FIG. 1, the ionized reactant gas can impact a metal source 107a, 107b to form a product, removing material for the metal source 107a, 107b by sputtering. Examples of suitable metallic sources include aluminum metal, silicon wafers, magnesium metal, zirconium, and titanium metal.

The deposition apparatus 101 comprises a substrate 113, where the product will be deposited. In some embodiments, as shown in FIG. 1, the substrate 113 may be mounted on a drum 109 that is rotated in a rotation direction 111 during the deposition to enable multiple substrates 113 to be coated in a relatively uniform manner. In further embodiments, the substrate 113 may comprise a plurality of coupons arranged in a row and/or array that can correspond to an article. In some embodiments, the substrate 113 may comprise a silicon wafer or a glass-based material. For example, an article may include sunglass lenses, RF transparent backings or housings of smartphones and similar devices, cover glass articles for smartphones and/or smart watches, heads-up display systems, automotive windows, mirrors, display surfaces, architectural glass and surfaces, and other decorative, optical, display, or protective applications. Such displays can include liquid crystal displays (LCDs), electrophoretic displays (EPD), organic light emitting diode displays (OLEDs), plasma display panels (PDPs), and touch sensors. Other embodiments of articles can include automotive glass for windows, sunroofs, or lamp covers. An article may comprise a transparent layer, for example, an amorphous inorganic material (e.g., glass), a crystalline material (e.g., sapphire, single crystal or polycrystalline alumina, spinel ($MgAl_2O_4$), or a polymer. Examples of suitable polymers include, without limitation, copolymers and blend thereof: thermoplastics including polystyrene (PS), polycarbonate (PC), polyesters including polyethyleneterephthalate (PET), polyolefins including polyethylene (PE), polyvinylchloride (PVC), acrylic polymers including polymethyl methacrylate (PMMA), thermoplastic urethanes (TPU), polyetherimide (PEI), epoxies, silicones including polydimethylsiloxane (PDMS), and blends of these polymers with each other. Examples of glass, which may be strengthened or non-strengthened and may be free of lithia or not, include soda lime glass, alkali aluminosilicate glass, alkali containing borosilicate glass and alkali aluminoborosilicate glass. As used herein, the term "strengthened" when applied to a substrate, for example glass or another transparent layer, may refer to a substrate that has been chemically strengthened, for example through ion-exchange of larger ions for smaller ions in the surface of the substrate. However, other strengthening methods known in the art, for example thermal tempering, or utilizing a mismatch of the coefficient of thermal expansion between portions of the substrate to create compressive stress and central tension regions, may be utilized to form strengthened substrates.

In some embodiments, the product to be deposited on the substrate 113 may comprise a metal oxide, a metal nitride, or a metal oxynitride. Examples of metal oxides include $Al_2O_3$, $ZrO_2$, $SiO_2$, $Al_2O_3$, $SiO$, $MgO$, $MgAl_2O_4$, and $TiO_2$. Examples of metal nitrides include $AlN$, $Si_3N_4$, $ZrN$, and $Mg_3N_2$. Examples of metal oxynitrides include $AlO_xN_y$, $SiO_xN_y$, $Si_uAl_vO_xN_y$, $TiO_xN_y$. Exemplary preferred $AlO_xN_y$ higher refractive index materials may comprise from about 0 atom % to about 20 atom % oxygen, or from about 5 atom % to about 15 atom % oxygen, while including 30 atom % to about 50 atom % nitrogen. Exemplary preferred $Si_uAl_vO_xN_y$ higher refractive index materials may comprise from about 10 atom % to about 30 atom % or from about 15 atom % to about 25 atom % silicon, from about 20 atom % to about 40 atom % or from about 25 atom % to about 35 atom % aluminum, from about 0 atom % to about 20 atom % or from about 1 atom % to about 20 atom % oxygen, and from about 30 atom % to about 50 atom % nitrogen. The foregoing materials may be hydrogenated up to about 30% by weight. These products may be deposited as one or more of scratch-resistant, anti-glare, and/or high-hardness layers. The average thickness of the deposited layer can be controlled by tuning the reaction time, input pressures, and the rotation speed of the drum 109. In some embodiments, the average thickness of the surface coating may be in the range from about 200 nanometers (nm) to about 5 mm, from about 200 nm to about 1 mm, from about 200 nm to about 500 µm, from about 500 nm to about 5 mm, from about 500 nm to about 1 mm, from about 500 nm to about 500 µm, from about 500 nm to about 100 µm, from about 500 nm to about 20 µm, from about 1 µm to about 5 mm, from about 1 µm to about 1 mm, from about 1 µm to about 500 µm, from about 1 µm to about 200 µm, from about 1 µm to about 100 µm, from about 1 µm to about 50 µm from about 1 µm to about 20 µm, from about 1 µm to about 10 µm, or from about 1 µm to about 5 µm.

The fluid distributor 103, 401, in accordance with the embodiments of the disclosure, can be used as part of the deposition apparatus 101 in a method of depositing a product on a substrate 113. First, fluids which may comprise a carrier gas 303a, a reactant gas 303b, and optionally a metallic gas are flowed through the inlet 301 of the fluid distributor 103, 401. Then, the fluid can be flowed within the first flow area of the first conduit 203. The fluid can then be flowed through the orifices of the first plurality of orifices 215a-h, 403a-h into the second flow area of the second conduit 201. Then, the fluid can be flowed through the second flow area of the second conduit 201. The fluid may be flowed through orifices of the second plurality of orifices 219a-g, 221a, 405a-g. In some embodiments, the mass-flow rate of the fluid through the orifices may differ by about 3% or less. In further embodiments, the mass flow rate through each orifice of the second plurality of orifices may be substantially equal. Then, the reactant(s) in the fluid are reacted with a metal to form a product. In some embodiments, the metal may be from a metal source 107a, 107b. In other embodiments, the metal may be ionized from a metallic gas. Then, the product may be deposited on the substrate 113 to form a layer of the product on the substrate 113.

In some embodiments, the first ratio may be greater than the second ratio. A technical benefit of fluid distributor 103, 401 of the disclosed herein is that it can achieve a substantially uniform steady state pressure distribution in the second flow area. Since the first ratio is at least about 2 or more, 2.5 or more, or 3.0 or more there is sufficient fluid volume within the first conduit 203 to compensate for variations in the fluid input (e.g., 303a, 303b) pressure and/or mass flow rate as well as variations in the ambient conditions in the rest of the deposition apparatus 101 that is incorporated into. This reduces the dynamic (e.g., time evolving) variation in the mass flow rate leaving the fluid distributor 103, 401, which contributes to a more uniform stoichiometry and a more uniform thickness of the product layer deposited on the substrate 113. Similarly, since the second ratio is at least about 2 or more, 2.5 or more, or 3.0 or more, the fluid distributor can compensate for variations in the in the ambient conditions in the rest of the deposition apparatus 101 that is incorporated into. Additionally, the different reactant gas(es) 303b and carrier gas(es) 303a may be well-mixed by the time the fluid flows through the second plurality of orifices 219a-g, 221a, 405a-g because the conduit-in-conduit design increases the average travel path for the fluid compared to a single conduit fluid distributor. Mixing may be further promoted when the first plurality of orifices faces away from the second plurality of orifices. Practically, this means that the angle between an orifice of the first plurality of orifices and an orifice of the second plurality of orifices is within a range from 45° and 180° and more preferably from 90° to about 180°. When the first plurality of orifices faces away from the second plurality of orifices, there is no direct momentum transfer from the fluid flowing through the first plurality of orifices to the fluid flowing through the second plurality of orifices because the fluid reorients and diffuses before leaving the second flow area.

In some embodiments, substantially the same fluid distribution for a given set of ratios may be obtained for a different set of smaller ratios without departing from the spirit and scope of this disclosure. For example, nozzles may be attached to the first plurality of orifices and/or the extension length of the second plurality of orifices is increased. Examples of nozzles include throttles and one-way valves. A throttle may be used to effectively reduce the cross-sectional area of an orifice. A one-way value may be used to prevent back-flow and recirculation within the fluid distributor. Embodiments employing these devices can be especially desirably when retrofitting an existing fluid distributor with non-ideal ratio(s). Similarly, one may attach extensions to the first plurality of orifices and/or extend the extension length of the second plurality of orifices to compensate for fluid distributors with non-ideal ratios. Such embodiments modify the effective resistance to flow of the corresponding orifice(s) of the first and/or second plurality of orifices such that the distributor has the same behavior as another distributor with a different ratio. One can determine an "effective" ratio by measuring the pressure drop across the first plurality of orifices and second plurality of orifices with nozzles and/or extensions and comparing those values to other fluid distributors with a larger ratio for the plurality of orifices that was modified under the same conditions. Alternatively, a loss coefficient or resistance coefficient analogous to that used in fluid dynamics for minor head loss could be used to determine an "effective" area ratio. Without wishing to be bound by theory, such modifications may produce pressure drops proportional to the product of the density of the fluid and the velocity of the fluid squared.

As discussed above, the fluid distributor 103, 405 of the current disclosure can achieve a more uniform mass flow rate across the second plurality of orifices than other fluid distributor designs. FIG. 5 shows the normalized mass flow rate through orifices in fluid distributors with different ratios between a combined cross-sectional flow area of a plurality of orifices of a conduit and a flow area of a conduit. All fluid distributors shown in FIG. 5 comprise an outer conduit (i.e., the second conduit as used in this disclosure) comprising two sets of seven orifices. The vertical axis represents a normalized mass flow rate. The horizontal axis represents a length of the conduit with the location of an orifice marked by a symbol. A modeled normalized mass flow rate versus length of a traditional, single-conduit fluid distributor with a first ratio of about 0.66 is represented by plot 501 having variations of more than 70%. A modeled normalized mass flow rate versus length of a traditional, single-conduit fluid distributor with a first area ratio of about 2.6 is represented by plot 503 and has variations of about 20%. A modeled normalized mass flow rate versus length of a traditional, single-conduit fluid distributor with a first area ratio of about 5.2 about 5.2 is represented by plot 505 and has variations of about 10%. A modeled normalized mass flow rate versus length of a traditional, single-conduit fluid distributor with a first area ratio of about 9.8 is represented by plot 507 and has a variation less than 5%. This modeled results demonstrate that the area ratio, with a first area ratio of about 2.0 or more and 2.5 or more are associated with variations of about 20% or less. However, the single-conduit fluid distributor shown in FIG. 5 does not produce well-mixed fluids. The conduit-in-conduit example embodiments discussed below produce well-mixed fluids.

Example A

The mass flow rates leaving a first set of orifices and a second set of orifices of the second plurality of orifices according to embodiments disclosed herein are shown in FIGS. 6 and 7, respectively. The vertical axis represents the % deviation from the average mass flow rate. Each bar along the horizontal axis corresponds to an orifice in the corresponding set of orifices of the second plurality of orifices in a direction of the length of the second conduit away from the inlet. The first conduit comprised a first length of 680 mm with a circular profile comprising an inner diameter of about 4.55 mm, corresponding to a first cross-sectional flow area of 6.28 mm$^2$. The first conduit further comprised eight orifices. Each orifice was circular with a diameter of 1 mm, corresponding to a first combined cross-sectional flow area of about 16.26 mm$^2$, and was spaced 80 mm apart with a 60 mm offset on each end. The second conduit comprised a second length of 730 mm with a circular profile comprising an inner diameter about 10.25 mm and two sets of seven orifices in the second plurality of orifices. Each orifice of the second plurality of orifices formed an angle of 112° with the first plurality of orifices. Each pair of second orifices (one from the first set of the second plurality of orifices and one from the second set of the second plurality of orifices) bisected the spacing between an adjacent pair of orifices of the second plurality of orifices. The first conduit comprised a thickness of about 0.9 mm and the second conduit comprised a thickness of about 1.25 mm. The second plurality of orifices comprised an extension length of 3 mm and comprised a circular cross-section with a diameter of about 0.5 mm, corresponding to a second combined cross-sectional flow area of 1.37 mm$^2$. Both conduits were capped, and the conduits were coincident. Thus, this embodiment of Example A corresponds to a first ratio of about 2.59 and a second ratio of about 4.58. Both ratios are about 2.0 or more and about 2.50 or more. Here, the first ratio is less than the second ratio. In FIG. 6, the maximum peak-to-peak deviation in the mass flow rate is about 2.1% between the second orifice and the fifth orifice. In FIG. 7, the maximum peak-to-peak deviation is 2.83% between the first orifice and the second orifice. All of the orifices are within about 1.5% of the mean mass flow rate, which is significantly better than the single-conduit example with a corresponding area ratio that had about 20% deviations (see FIG. 5, plot 503 and associated description).

Example B

The mass flow rates leaving a first set or orifices and a second set of orifices of the second plurality of orifices according to embodiments disclosed herein are shown in FIGS. 8 and 9, respectively. The vertical axis represents the % deviation from the average mass flow rate. Each bar along the horizontal axis corresponds to an orifice in the corresponding set of orifices of the second plurality of orifices in a direction of the length of the second conduit away from the inlet. The first conduit comprised a first length of 680 mm with a circular profile comprising an inner diameter of about 4.55 mm, corresponding to a first cross-sectional flow area of 16.26 mm$^2$. The first conduit further comprised eight orifices. Each orifice was circular, but the dimeter the first plurality of orifices monastically increased moving away from the inlet with corresponding values of 0.5 mm, 0.5 mm, 0.6 mm, 0.6 mm, 0.7 mm, 0.7 mm, 1.0 mm, 1.0 mm. This corresponds to a first combined cross-sectional flow area of about 3.30 mm$^2$, and each orifice was spaced 80 mm apart with a 60 mm offset on each end. The second conduit comprised a second length of 730 mm with a circular profile comprising an inner diameter about 10.25 mm and two sets of seven orifices in the second plurality of orifices. Each orifice of the second plurality of orifices formed an angle of 112° with the first plurality of orifices. Each pair of second orifices (one from the first set of the second plurality of orifices and one from the second set of the second plurality of orifices) bisected the spacing between an adjacent pair of orifices of the first plurality of orifices. The first conduit comprised a thickness of about 0.9 mm and the second conduit comprised a thickness of about 1.25 mm. The second plurality of orifices comprised an extension length of 3 mm and comprised a circular cross-section with a diameter of about 0.5 mm, corresponding to a second combined cross-sectional flow area of 1.37 mm$^2$. Both conduits were capped, and the conduits were coincident. Thus, this embodiment of Example B corresponds to a first ratio of about 4.93 and a second ratio of about 2.41. Both ratios are about 2.0 or more. The first ratio is greater than the second ratio. Also, the second ratio is about 2.0 or more, about 2.5 or more, about 3 or more, and about 4 or more. In FIG. 8, the maximum peak-to-peak deviation in the mass flow rate is about 0.37% between the second orifice and the seventh orifice. In FIG. 9, the maximum peak-to-peak deviation is 0.80% between the first orifice and the seventh orifice. All of the orifices are within about 1.5% of the mean mass flow rate, which is significantly better than the single-conduit example with a corresponding area ratio that had about 20% deviations (see FIG. 5, plot 503 and associated description). Despite the second ratio being smaller in Example B than in Example A, the peak-to-peak deviation significantly decreased because the first ratio was greater than the second ratio in Example B but not in Example A.

As used herein, the term "disposing" includes coating, depositing and/or forming a material onto a surface using any known method in the art. The disposed material may constitute a layer, as defined throughout the disclosure. The phrase "disposed on" includes embodiments of forming a material onto a surface such that the material is in direct contact with the surface and also includes embodiments where the material is formed on a surface, with one or more intervening material(s) positioned between the disposed material and the surface. In some of the embodiments, the intervening material(s) may constitute one or more layers.

Throughout the disclosure, the term "layer" may include a single layer or may include one or more sub-layers. In some embodiments, a stack of sub-layers may be provided with each sub-layer in the stack being in direct contact with at least one other sub-layer in the stack. Such sub-layers may be in direct contact with one another. The sub-layers may be formed from the same material or two or more different materials. In one or more alternative embodiments, such sub-layers may have intervening layers of different materials disposed therebetween. In one or more embodiments, a layer may include one or more contiguous and uninterrupted layers. A layer or sub-layers may be formed by various techniques, for example discrete deposition and/or continuous deposition processes. In one or more embodiments, the layer may be formed using only continuous deposition processes, or, alternatively, only discrete deposition processes.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially similar" is intended to denote that two values are equal or approximately equal. In some embodiments, "substantially similar" may denote values within about 10% of each other, for example within about 5% of each other, or within about 2% of each other.

The above embodiments, and the features of those embodiments, are exemplary and can be provided alone or in any combination with any one or more features of other embodiments provided herein without departing from the scope of the disclosure.

It will be apparent to those skilled in the art that various modifications and variations can be made to the present disclosure without departing from the spirit and scope of the disclosure. Thus, it is intended that the present disclosure cover the modifications and variations of this disclosure provided they come within the scope of the appended claims and their equivalents.

What is claimed is:

1. A fluid distributor comprising:
a first conduit extending along a first elongated axis, the first conduit comprising a first plurality of orifices comprising a first combined cross-sectional flow area, a first flow area comprising a first cross-sectional flow area taken perpendicular to the first elongated axis, a first ratio of the first cross-sectional area to the first combined cross-sectional flow area is about 2 or more, and a first orifice of the first plurality of orifices comprises an orifice axis that is perpendicular to the first elongated axis; and
a second conduit extending along a second elongated axis, the second conduit circumscribing the first conduit to define a second flow area between the first conduit and the second conduit, the second conduit comprising a second plurality of orifices comprising a second combined cross-sectional flow area, a second ratio of the first combined cross-sectional flow area of the first plurality of orifices to the second combined cross-sectional flow area of the second plurality of orifices is about 2 or more, and a first orifice of the second plurality of orifices comprises an orifice axis that is perpendicular to the second elongated axis,
wherein a first angle between a direction of the orifice axis of the first orifice of the first plurality of orifices and a direction of the orifice axis of the first orifice of the second plurality of orifices is in a range from about 45° to about 180°; and
wherein a second orifice of the second plurality of orifices comprises a second orifice cross-sectional flow area, the first orifice of the second plurality of orifices comprises a first orifice cross-sectional flow area, the first orifice of the second plurality of orifices is closer to an inlet of the first conduit than the second orifice of the second plurality of orifices, and the second orifice cross-sectional flow area is greater than the first orifice cross-sectional flow area.

2. The fluid distributor of claim 1, wherein the first ratio is greater than the second ratio.

3. The fluid distributor of claim 1, wherein the first angle is in a range from about 90° to about 180°.

4. The fluid distributor of claim 1, wherein the first angle is in a range from about 90° to about 135°.

5. The fluid distributor of claim 1, wherein the first angle is in a range from about 170° to about 180°.

6. The fluid distributor of claim 1, wherein the first plurality of orifices are staggered relative to the second plurality of orifices in a direction of the first elongated axis.

7. The fluid distributor of claim 1, wherein the first conduit comprises an inner circular profile taken along a cross-section perpendicular to the first elongated axis.

8. The fluid distributor of claim 1, wherein the second conduit comprises an inner circular profile taken along a cross-section perpendicular to the second elongated axis.

9. The fluid distributor of claim 1, wherein the second orifice of the second plurality of orifices comprises an orifice axis that is perpendicular to the second elongated axis, an angle between the direction of the orifice axis of the first orifice of the second plurality of orifices and a direction of the orifice axis of the second orifice of the second plurality of orifices is in a range from about 45° to about 180°.

10. The fluid distributor of claim 9, wherein the angle between the direction of the orifice axis of the first orifice of the second plurality of orifices and the direction of the orifice axis of the second orifice of the second plurality of orifices is in a range from about 90° to about 135°.

11. The fluid distributor of claim 1, wherein the second orifice of the second plurality of orifices comprises an orifice axis that is perpendicular to the second elongated axis, the orifice axis of the first orifice of the second plurality of orifices and the orifice axis of the second orifice of the second plurality of orifices extend along a first common plane perpendicular to the second elongated axis.

12. The fluid distributor of claim 1, wherein a second orifice of the first plurality of orifices comprises an orifice axis extending perpendicular to the first elongated axis, a third orifice of the first plurality of orifices comprises an orifice axis extending perpendicular to the first elongated axis, the orifice axis of the first orifice of the first plurality of orifices is spaced a first distance from the orifice axis of the second orifice of the first plurality of orifices, the orifice axis of the third orifice of the first plurality of orifices is spaced a second distance from the orifice axis of the second orifice of the first plurality of orifices, and the first distance is substantially equal to the second distance.

13. The fluid distributor of claim 12, wherein the orifice axis of the first orifice of the first plurality of orifices, the orifice axis of the second orifice of the first plurality of orifices, and the orifice axis of the third orifice of the first plurality of orifices extend along a second common plane containing the first elongated axis.

14. The fluid distributor of claim 1, wherein the first elongated axis is coincident with the second elongated axis.

15. The fluid distributor of any one of claim 14, wherein a second orifice of the first plurality of orifices comprises an orifice axis extending perpendicular to the first elongated axis, the orifice axis of the first orifice of the first plurality of orifices is spaced a first distance from the orifice axis of the first orifice of the second plurality of orifices, the orifice axis of the second orifice of the first plurality of orifices is spaced a second distance from the orifice axis of the second orifice of the first plurality of orifices, and the first distance is substantially equal to the second distance.

16. The fluid distributor of claim 1, wherein a second orifice of the first plurality of orifices comprises a second orifice cross-sectional flow area, the first orifice of the first plurality of orifices comprises a first orifice cross-sectional flow area that is substantially equal to the second cross-sectional flow area.

17. The fluid distributor of claim 1, wherein the first plurality of orifices are contained in a plane containing the first elongate axis.

* * * * *